Feb. 8, 1966 N. B. BRAYMER 3,234,478

WIDE BAND AMPLIFIER

Filed Aug. 18, 1961 4 Sheets-Sheet 1

INVENTOR.
NOEL B. BRAYMER
BY Louis J. Knobbe
ATTORNEY

*INVENTOR.*
NOEL B. BRAYMER
*BY* Louis J. Knobbe
ATTORNEY

Feb. 8, 1966 N. B. BRAYMER 3,234,478

WIDE BAND AMPLIFIER

Filed Aug. 18, 1961 4 Sheets-Sheet 3

INVENTOR.
NOEL B. BRAYMER
BY Louis J. Knobbe
ATTORNEY

Feb. 8, 1966 N. B. BRAYMER 3,234,478
WIDE BAND AMPLIFIER
Filed Aug. 18, 1961 4 Sheets-Sheet 4

*INVENTOR.*
NOEL B. BRAYMER
*BY* Louis J. Knobbe
ATTORNEY

United States Patent Office 3,234,478
Patented Feb. 8, 1966

3,234,478

WIDE BAND AMPLIFIER

Noel B. Braymer, Escondido, Calif., assignor to Beckman Instruments, Inc., a corporation of California Filed Aug. 18, 1961, Ser. No. 132,365
9 Claims. (Cl. 330—9)

This invention relates to electronic amplifiers and particularly to an ultralinear wide-band amplifier providing isolation between its input and output terminals.

In applicant's copending application Serial No. 823,796, now U.S. Patent No. 3,130,373, entitled "Potential Difference Transfer Device," filed April 27, 1959, an ultralinear amplifier is described in which the input terminals are isolated from the output terminals. As described in this application, such isolation is required for low level signals because of the substantially larger common mode potentials. Although the amplifier described in this copending application provides a highly accurate amplifier for signals having a frequency range from direct current to a relatively low alternating current frequency, e.g., 100 cycles per second, an amplification means having a wider frequency bandwidth is required for systems handling higher frequency input signals.

In the invention described in the copending application entitled "Potential Difference Transfer Device," supra, and in the present invention, transformers are utilized in the feedback path for providing the required isolation between the amplifier input and output terminals. The present state of the transformer art is such that with contemporary core materials extremely linear transformers may be designed for this type of amplifier. A limitation imposed by transformers is that only alternating currents can be passed therethrough, i.e., transformers have a low frequency limit which makes it impossible to pass a signal at, or very near to, direct current. Moreover, transformers are characterized by a volt-second limitation. That is, if the time integral of volts exceeds this limit, the transformer core becomes saturated and its inductance is severely reduced. The passage of alternating current signals is then seriously impaired. For a highly accurate ultralinear amplifier this impairment of signal transfer cannot be tolerated, particularly since the transformer action may be impeded for a period of time which is long compared to a cycle of the alternating current signal.

Average current may be applied to the feedback isolation transformer in several ways, the most usual being applying signals to the forward and feedback modulators which are equal, or very nearly equal to the modulation carrier frequencies. As is well known, the lower side frequency of an amplitude modulated signal represents the difference between the carrier and modulation frequencies. Thus, when these frequencies are equal, a zero frequency or direct current signal is supplied to the isolation transformer.

In the amplifier described in the copending application entitled, "Potential Difference Transfer Device," supra, the problem of signal impairment due to core saturation is substantially obviated by using a modulation carrier frequency in the feedback path which is substantially higher in frequency than the highest signal input frequency, i.e., a typical carrier frequency is 400 c.p.s. while the highest input signal usually is 100 c.p.s. In a wide-band ultralinear amplifier, this mode of operation is no longer successful due to the difficulty of achieving an extremely linear feedback path utilizing very high frequency modulators and demodulators.

It is therefore the primary object of this invention to provide an ultralinear wide-band amplifier providing isolation between its input and output terminals which provides a relatively wide frequency band, e.g., 0–100,000 c.p.s.

It is another object of the present invention to provide an ultralinear amplifier providing isolation between its input and output terminals utilizing isolation transformers and a feedback modulating drive frequency lower than the highest input signal frequency.

Still another object of the present invention is to provide an amplifier employing transformer isolation between its input and output terminals which is characterized by ultralinear operation although direct current is supplied to the feedback isolation transformer means.

Other and further objects, features and advantages of the invention will become apparent as the description proceeds.

Briefly, in accordance with a preferred form of the present invention, a wide-band, ultralinear amplifier having isolation between its input and output terminals comprises a wide-band high gain forward conduction path for an error signal having both direct current and alternating current frequencies. This error signal is the sum of the amplifier input signal and a feedback signal derived from the output thereof. This forward path must include an isolation means such as one or more isolation transformers. The feedback portion of the amplifier includes polyphase paths preferably comprising two independent full wave, two phase paths operating in quadrature phase relationship with each other. Each of these paths includes a series coupled modulator, an isolation transformer and a demodulator. The switches in each of the modulators and demodulators are designed and driven so that no single path continuously connects the isolation transformer windings to closed or ON switches. Rather, for a predetermined portion of each cycle of drive signal, the modulator and demodulator switches remain OFF, thereby alternately open circuiting the transformer windings in the feedback paths for a definite, but short, period of time. During this period of time, the transformer is allowed to correct itself by inducing a corrective signal in it. As will be more fully described hereinafter in the specification, this operation prevents an average current from flowing in either the primary or secondary windings of a feedback isolation transformer by equating the volt-seconds of the transformer while connected to ON switches and the volt-seconds of the transformer while open circuited. With no average current flowing in their windings, the transformer cores do not saturate thus avoiding the limitation of the prior art circuitry wherein direct current could not be applied to the transformer windings. Thus, signals equal in frequency to the feedback drive signal may be transmitted through the feedback path without adverse effect. By using two feedback paths operating in phase quadrature, the two paths are caused to operate in alternation. The amplifier feedback signal is then never interrupted since either one or the other of the feedback paths is conductive at any given instant of time.

A more thorough understanding of the present invention may be obtained from the following detailed description taken in connection with accompanying drawings in which.

Figure 1:
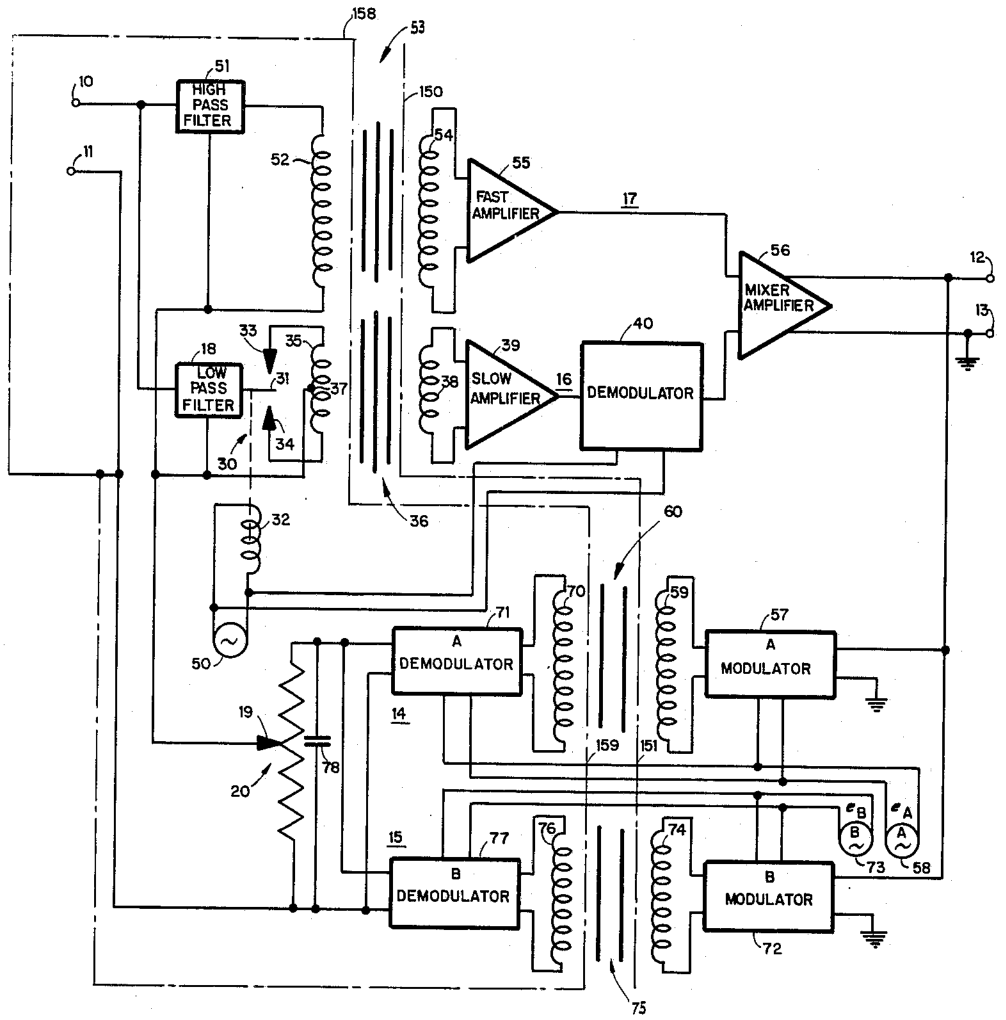
FIG. 1 is a circuit diagram of a preferred embodiment of the present invention in which certain portions of the circuit are shown in block diagram form.

In FIG. 1 there is shown according to the invention an ultralinear wide-band amplifier having isolation between input terminals 10, 11 and output terminals 12, 13. In the usual application of this type of amplifier, both of the input terminals as shown have a high impedance to ground whereas one of the output terminals 13 is shown connected directly to ground. Normally, input terminals 10 and 11 are connected to the leads of a transducer (not shown) which may be a thermocouple, a strain gauge, a thermistor or the like. Normally, there is an impedance path between the input signal circuit and ground adjacent the transducer and, in many instances, the transducer case or other portion thereof will be directly grounded. As transducer ground and the ground of the amplifier circuit are in many cases different, a voltage will exist which is common to both of the transducer signal leads. This voltage may be conveniently defined as the potential difference between circuit ground and a signal lead having the lower impedance to ground and is called common mode voltage. This is independent of the signal voltage and may be considerably greater in magnitude than the input signals. However, by isolating both input terminals of the amplifier, only the potential between the signal leads is applied to the amplifier.

In the amplifier shown, an error signal, derived from an addition of the input signal applied between input terminals 10, 11 and a feedback signal from the polyphase feedback paths 14, 15 to be described hereinafter, is applied to a parallel connected low frequency forward conduction path 16 and high frequency forward conduction path 17. Low frequency path 16 includes a low pass filter 18 connected between input terminal 10 and movable contact 19 of feedback potentiometer 20. This filter may be of conventional design for passing direct current and low frequency alternating signal inputs, e.g., 0 to 100 c.p.s., with minimum attenuation. Because of the well known zero drift problems inherent in direct coupled amplifiers, low frequency forward path includes a modulator 30 coupled to the output of low pass filter 18 to provide an amplitude modulated signal. Not only does this modulation permit more accurate amplification, but also allows a transformer to be used as an isolation means between the amplifier input and output terminals. Modulator 30 may be of any conventional type but is preferably a mechanical chopper having a moving arm 31 driven by driving winding 32 and stationary contacts 33 and 34. This type of chopper is preferred for the modulator 14 because the low impedance obtainable by the contacts of the mechanical chopper are best suited for use with transducers which generally have a very low voltage range. One output of the low pass filter 18 is connected to the moving arm 31 and the stationary contacts 33, 34 are respectively connected to the ends of primary winding 35 of isolation transformer 36. The other output terminal of the low pass filter 18 is connected to a center tap 37 of the primary winding 35.

Secondary winding 38 of isolation transformer 36 is connected to the input of slow amplifier 39. This amplifier may utilize conventional circuitry and is designed to have very high gain and linear operation for the relatively low frequency modulated drive signal. The output of slow amplifier 39 is coupled to the input of demodulator 40. As the signal level has been increased by the gain of amplifier 39, more convenient electrical demodulators, such as transistor switches, can be used in place of a mechanical chopper for demodulator 40. A transistor demodulator will usually consist of two alternately opening and closing transistor switches, each of which introduces a voltage and current offset. Where the incoming signal is very small, this offset would be a serious source of error; however, amplifier 39 provides a high signal level, thus proportionately reducing any error due to the uncompensated offset in the demodulator. As shown, demodulator 40 is driven in synchronism with the driving winding 32 of modulator 30 by drive frequency source 50.

High frequency forward conduction path 17 includes high pass filter 51 connected in parallel with low pass filter 18 between input terminal 10 and movable contact 19 of feedback potentiometer 20. This filter may be of conventional design for passing alternating current signal inputs above a relative low frequency, e.g., above 100 c.p.s., with minimum attenuation. The output terminals of high pass filter 51 are coupled to opposite ends of primary winding 52 of isolation transformer 53.

Secondary winding 54 of isolation transformer 53 is connected to the input of fast amplifier 55. This amplifier may utilize conventional circuitry and is designed to have very high gain and linear operation for all input signals above the range transmitted through the low frequency forward conduction path 16.

The operation of the forward conduction paths so far described is as follows: Modulator 30, isolation transformer 36, slow amplifier 39 and demodulator 40 are used as a high gain path for input signals from direct current to a relatively low alternating frequency, e.g., 0 to 100 c.p.s. With modulator 30 operating at the drive frequency supplied from source 50, current will alternately flow in opposite sense in the primary winding 35 of isolation transformer 36 when there is an error voltage but no current flow will result when the error voltage is zero. The resulting alternating current signal from the modulator 30 is transmitted through isolation transformer 36 and amplified in slow amplifier 39 which is designed to have very high gain and linear operation for the relative low frequency amplitude modulated signal. The low frequency portion of the input signal appears at the output of demodulator 40, but at a substantially higher signal level.

All input signal frequencies above direct current and relatively low frequency appear at a substantially higher signal level at the output of fast amplifier 55. Because of their original alternating nature, no modulation means is required in the forward conduction path 17.

The resultant direct current and slowly varying alternating current signals from the output of demodulator 40 and the higher alternating current signals from the output of fast amplifier 55 are combined in mixer amplifier 56 which may also be of conventional design. The output terminals 12, 13 are coupled to the output of mixer amplifier 56. Mixer amplifier 56 preferably includes an output stage of the operational amplifier type in accordance with the teachings of the copending application entitled, "Potential Difference Transfer Device," supra. As described in this copending application, the operational amplifier drives the feedback path from a high level voltage source having a very low output impedance. This high level voltage provides a high signal-to-noise ratio for noise introduced in the feedback path and the low impedance output insures that error voltages caused by current flow in the feedback path are inherently of a very low magnitude.

As heretofore noted, the isolation transformers utilized in the type of amplifier described herein become disabled for a time period which is long compared to the cycle of the alternating current being transferred therethrough when supplied with an average current so that the application of direct current thereto must usually be avoided. In the forward path, low pass filter 18 insures that signals equal in frequency to the carrier frequency are not applied to the modulator 30 thereby insuring that transformer 36 does not encounter any saturating direct currents. In like manner, high pass filter 51 insures that direct currents are not applied to isolation transformer 53.

It will be recognized that forward conduction paths 16 and 17 and mixer amplifier 56 provide a high gain, linear amplification of signals within a fairly wide frequency range, e.g., 0 to 100,000 c.p.s. or higher while maintaining isolation between the amplifier input and output terminals. The particular circuitry shown for achieving this wide band signal amplification does not begin to exhaust the circuitry which will become apparent to those skilled in the art, and the present scope of the invention is in no way to be limited to the forward conducting circuitry described hereinabove. The significant improvement afforded by this invention is within the feedback circuitry described hereinafter.

The feedback path of the present invention as shown in FIG. 1 comprises parallel connected A and B feedback paths 14 and 15. These paths include amplitude modulation means for converting all direct current and slowly varying amplifier output signals to higher frequency alternating current signals for conduction through isolation transformers. Thus, the A feedback path includes A modulator 57 driven by drive signal $e_A$ from the A drive frequency source 58 for modulating the signal from the output terminals 12, 13. Primary winding 59 of isolation transformer 60 is connected to the output of the A modulator. Secondary winding 70 of isolation transformer 60 is connected to the input of A demodulator 71 driven in synchronism with the A modulator 57 by the A drive frequency source 58. In similar manner, the B feedback path 15 comprises B modulator 72 driven by drive signal $e_B$ from the B drive frequency source 73 for modulating the signal from the output terminals 12, 13. Primary winding 74 of isolation transformer 75 is connected to the output of the B modulator. Secondary winding 76 of isolation transformer 75 is connected to the input of B demodulator 77 driven in synchronism with the B modulator 72 by the B drive frequency source 73. For reasons given below, the A and B drive frequency signals $e_A$ and $e_B$ must be out of phase with each other. The A and B drive frequency sources 58 and 73 may be separate sources, or preferably a single signal source coupled to a phase delay circuit of conventional design. The output of the signal source is the signal $e_A$ and the output of the phase delay circuit is $e_B$. Any losses in the phase delay circuit may be compensated for by either attenuating $e_A$ or amplifying $e_B$. The A and B drive frequency sources are ordinarily transformer coupled to the respective modulators and demodulators (as shown hereinafter) to preserve the isolation between the amplifier input and output terminals.

A and B demodulators 71, 77 are connected across a parallel connected smoothing filter which may be simply a capacitor 78 as shown and feedback potentiometer 20. Movable contact 19 of feedback potentiometer 20 is adjusted to provide the desired amount of feedback potential connected in series with the signal connected between input terminals 10 and 11.

Although the operation of the feedback circuitry shown in FIG. 1 will be described in more detail hereinafter, the operation thereof is briefly as follows: The parallel connected A and B paths serve to alternately connect and disconnect the feedback isolation transformers between the output terminals 12, 13 and feedback potentiometer 20. For accomplishing this operation, the feedback modulator and demodulator switches are driven to their ON or closed state for only a portion of each complete cycle of drive signal. For reasons described below, this operation prevents an average current from flowing in the transformer windings because the transformers when coupled to switches in their OFF or open state correct themselves by developing a volt-second characteristic equal and opposite to the volt-second characteristic developed during the period that the transformers are coupled to switches in their ON or closed state.

During a period that the feedback modulator and demodulator switches are open, the feedback current flow is of course interrupted. For extremely accurate amplification this loss of feedback signal cannot be tolerated. The present invention obviates such interruption by driving the modulator and demodulator switches of feedback paths A and B so that one or the other of these paths is always conducting a feedback signal. In a preferred embodiment of the feedback circuitry, the respective paths A and B are driven at quadrature with each other, and the dwell or closed-time of the modulator and demodulator switches is approximately 60% of a cycle of carrier frequency and their OFF or open-time is approximately 40% of a cycle of drive frequency. This operation provides an overlapping conduction by the feedback paths, i.e., for a portion of each cycle of drive signal, both paths are conducting feedback current. The smoothing capacitor 78 limits any change in signal across feedback potentiometer 20 caused by this brief period of simultaneous conduction.

Amplifiers constructed according to this invention are thus able to feed back signals having a frequency which is equal to that of the feedback drive signal since transformer saturation effects are avoided. The transformers 60 and 75 in the A and B feedback paths, however, provide the desired isolation between the inputs and outputs of the feedback paths so as to preserve the desired isolation between the amplifier input and output terminals.

Figure 2:
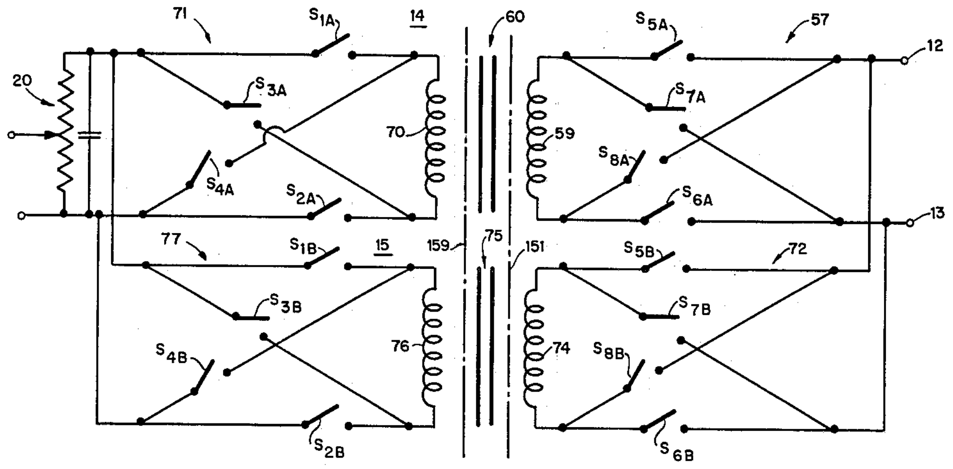
FIG. 2 is a simplified schematic drawing of an isolating feedback circuit constructed in accordance with this invention.

FIG. 2 illustrates in simplified schematic form representative circuitry which may be utilized for constructing the A and B feedback paths 14 and 15. Components in the circuit of FIG. 2 corresponding to those of FIG. 1 are identified by the same reference numerals. As shown, the A feedback modulator 57 includes switches $S_{5A}$, $S_{6A}$, $S_{7A}$ and $S_{8A}$ connected as a full wave, ring modulator between the output terminals 12, 13 and the primary winding 59 of isolation transformer 60. The A feedback demodulator 71 includes switches, $S_{1A}$, $S_{2A}$, $S_{3A}$ and $S_{4A}$ connected between the secondary winding 70 of transformer 60 and the feedback potentiometer 20 in a manner similar to the A feedback modulator 57. The B feedback path 15 as shown in FIG. 2 includes identical switch circuitry in the B modulator 72 and the B demodulator 77, the B modulator 72 including respective switches $S_{5B}$, $S_{6B}$, $S_{7B}$ and $S_{8B}$ connected as a full wave, ring modulator between the output terminals 12, 13 and the primary winding 74 of isolation transformer 75 and the B demodulator including respective switches $S_{1B}$, $S_{2B}$, $S_{3B}$ and $S_{4B}$ connected between the secondary winding 76 of isolation transformer 75 and the feedback potentiometer 20.

Figure 3:
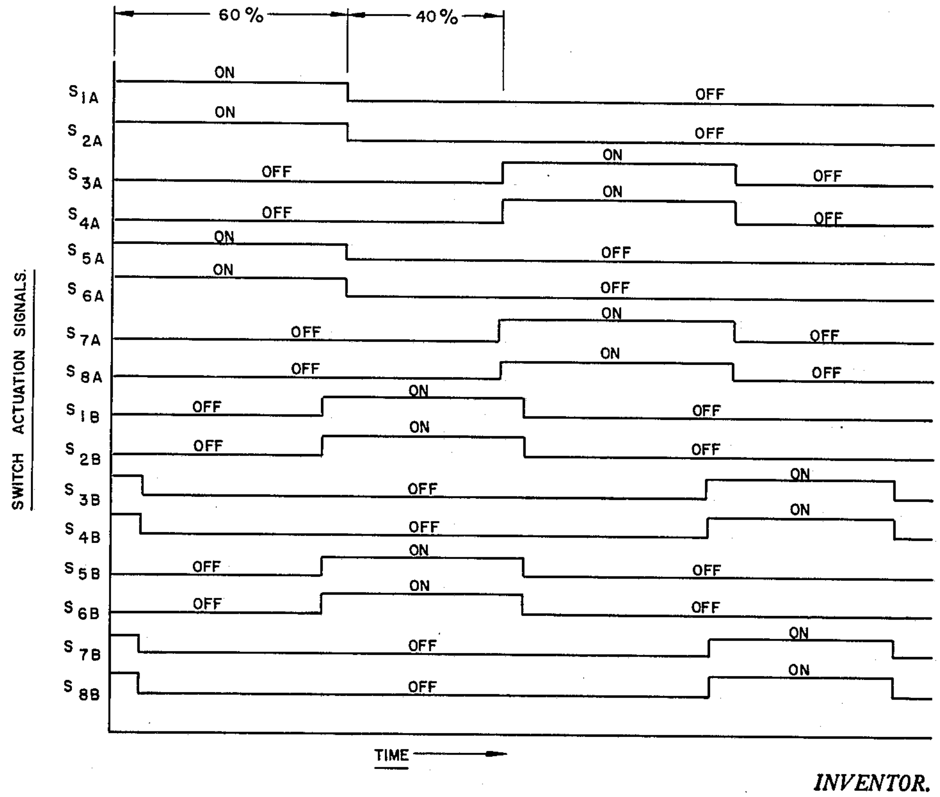
FIG. 3 illustrates the actuation periods for the switches of FIG. 2.

The actuation periods of the modulator and demodulator switches are illustrated in FIG. 3 for each of the respective switches. This figure illustrates one complete cycle of actuation for each of the modulator and demodulator switches. It may be noted that each of the switches in a respective modulator and demodulator are closed or ON during 60% of each half cycle and opened or turned OFF for the remainder of a complete cycle.

Thus, switches $S_{5A}$ and $S_{6A}$ of the A modulator 57 are initially turned ON for 60% of the initial half cycle and turned OFF for the remainder of a complete cycle, while switches $S_{7A}$ and $S_{8A}$ of the A modulator 57 are turned ON for 60% of the alternate half cycles and OFF for the remainder of each complete cycle. In this way, the output terminals 12 and 13 of the amplifier are connected by closed switches of modulator 57 to primary winding 59 of isolation transformer 60 for 60% of each complete cycle. The operation of the A demodulator is identical to that of the A modulator, the dwell-times for switches $S_{1A}$ and $S_{2A}$ being 60% of the initial half cycle whereas the dwell-times for switches $S_{3A}$ and $S_{4A}$ are 60% of each alternate half cycle. Each of these switches are turned OFF for the remainder of each complete cycle.

The switches of the B modulator 72 and B demodulator 77 are actuated in quadrature relationship to that of the A modulator and A demodulator. Thus, as shown in FIG. 3 switches $S_{5B}$ and $S_{6B}$ of the B modulator 72 are not turned ON until a quarter cycle after switches $S_{5A}$ and $S_{6A}$ of the A modulator are turned ON. Other than the 90° phase difference in actuation of the switches in the A and B feedback paths, the operation of the feedback paths is quite similar. Thus, switches $S_{5B}$ and $S_{6B}$ are turned ON for 60% of the initial half cycle and turned OFF for the remainder of the complete cycle whereas switches $S_{7B}$ and $S_{8B}$ of the B modulator 72 are turned ON for 60% of the alternate half cycle and turned OFF for the remainder of each complete cycle. The B demodulator 77 functions in a manner identical with that of the B modulator 72.

An examination of FIG. 3 will reveal that in each of the feedback paths, the output terminals 12 and 13 of the amplifier are conducted between the input and output of a respective A or B feedback path for only 60% of each complete cycle. Thus, the switches $S_{5A}$, $S_{6A}$, $S_{7A}$ and $S_{8A}$ are all open at the same time for a predetermined portion of each half portion of each half cycle. However, the quadrature actuation of the modulator and demodulators in the A and B feedback paths is such that both feedback paths are never open at the same time. For example, before the switches $S_{5A}$ and $S_{6A}$ are turned OFF, the switches $S_{5B}$ and $S_{6B}$ of the B modulator 72 are turned ON. By maintaining the dwell-time for each of the switches greater than half of each cycle, e.g., 60% as shown in FIG. 3, the two feedback paths slightly overlap in their conduction periods. This overlapping action positively prevents interruption of the signal between the input and output of the feedback loop.

The selection of the 60% ON and 40% OFF-times for each half cycle operation of a modulator and demodulator is only one example of an operative relationship. It will be apparent to those skilled in the art that an overlapping operation of the feedback paths may be obtained with a number of different dwell and OFF-times for the A and B modulators and demodulators. Such overlapping action will occur if the dwell-time for each of the switches is greater than 50% of each half cycle of operation. As discussed hereinafter, the amount that the dwell-time for each of the switches can be increased greater than 50% of each half cycle will be determined by the time required to discharge the energy stored in the transformer windings when the transformer is open circuited. It may further be noted that although an overlapping action will ordinarily be preferred, careful construction of each of the feedback paths insuring precise conduction periods would allow each of the paths to be constructed so as to maintain the dwell time for each of the switches at exactly 50% of each half cycle. So constructed, however, any delay in opening and closing a switch will result in a failure to pass a feedback signal for a small period of time. For this reason, an overlapping action will ordinarily be preferred so as to compensate for any imperfections in the modulator and demodulator circuitry.

Figure 4:
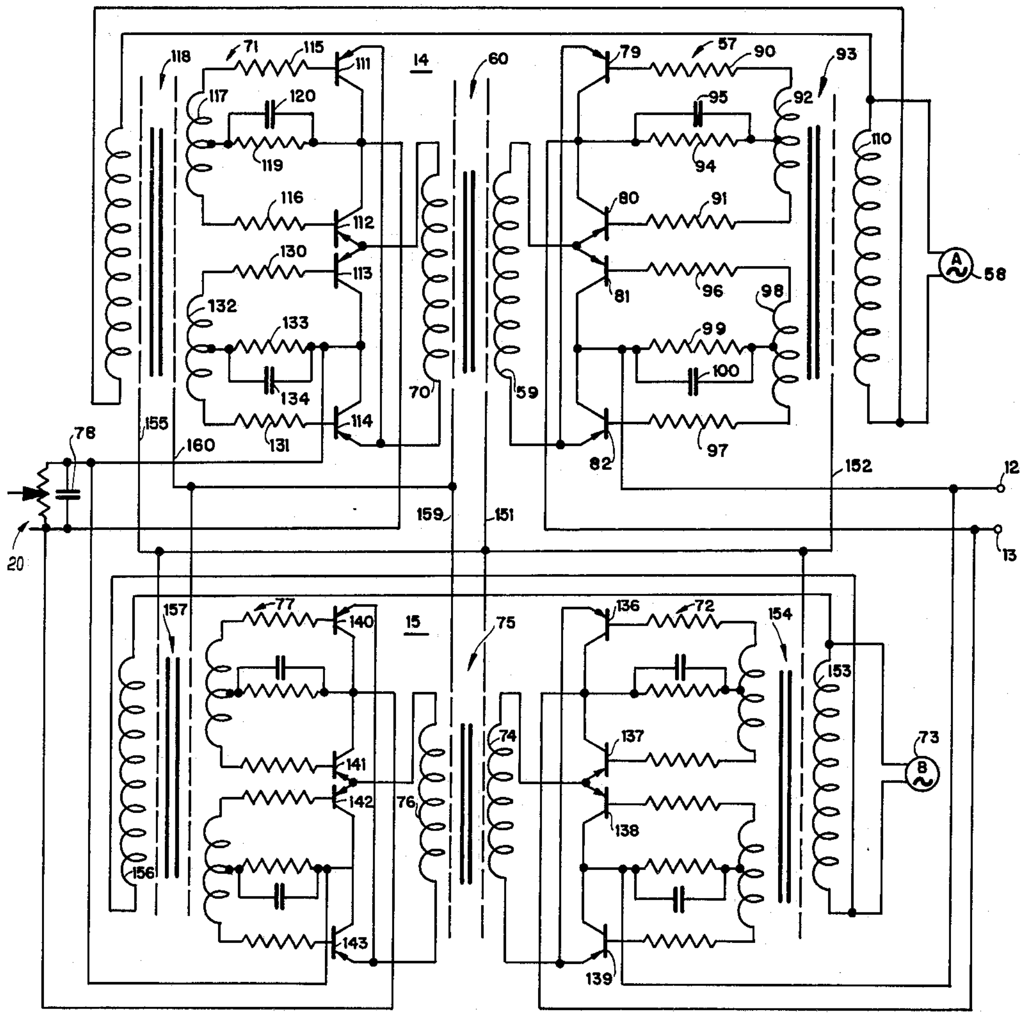
FIG. 4 is a complete schematic diagram of feedback circuitry for amplifiers constructed in accordance with this invention.

FIG. 4 illustrates specific circuitry for a preferred embodiment of the A and B feedback paths 14 and 15. Components in the circuit of FIG. 4 corresponding to those of FIG. 1 are identified by the same reference numerals. As shown, the A feedback modulator 57 includes transistors 80 and 82 respectively operating as switches $S_{5A}$ and $S_{6A}$ of FIG. 2 and transistors 79 and 81 respectively operating as switches $S_{7A}$ and $S_{8A}$ of FIG. 2. By means of resistors 90 and 91 connecitng the opposite ends of a secondary winding 92 of a transformer 93 to the bases of transistors 79 and 80, and a parallel connected resistor 94 and capacitor 95 connecting the midpoint of secondary winding 92 to the common connection between the collectors of transistors 79 and 80, the transistors 79 and 80 are controlled by the voltage of the secondary winding 92. In like manner, resistors 96 and 97 couple the opposite ends of a secondary winding 98 of the transformer 93 to the bases of transistors 81 and 82, and a parallel connected resistor 99 and capacitor 100 connect the midpoint of secondary winding 98 to the common connection between the collectors of transistors 81 and 82 to control the conduction of transistors 81 and 82 by the voltage of secondary winding 98. The A drive frequency source 58 is connected to a primary winding 110 of the transformer 93 for driving the modulator. Output terminal 12 of the amplifier is connected to the common connection between the collectors of transistors 81 and 82 and output amplifier terminal 13 is connected to the common connection of the collectors of transistors 79 and 80. The modulated A feedback signal is then developed across the primary winding 59 of isolation transformer 60 and the secondary winding 70 of this transformer couples the modulated A feedback signal to the feedback demodulator 71.

The A feedback demodulator 71 includes transistors 112 and 114 respectively operating as switches $S_{1A}$ and $S_{2A}$ of FIG. 2 and transistors 111 and 113 respectively operating as switches $S_{3A}$ and $S_{4A}$ of FIG. 2. By means of resistors 115 and 116 connecting the opposite ends of a secondary winding 117 of a transformer 118 to the bases of transistors 111 and 112 and a parallel connected resistor 119 and capacitor 120 connecting the midpoint of the secondary winding 117 to the common connection between the collectors of transistors 111 and 112, these transistors are controlled by the voltage of the secondary winding 117. In similar manner, resistors 130 and 131 couple the opposite ends of a secondary winding 132 of the transformer 118 to the bases of transistors 113 and 114 and parallel coupled resistor 133 and capacitor 134 connect the midpoint of secondary winding 132 to the common connection between collectors of transistors 113 and 114 to control these transistors by the voltage of secondary winding 132. The A drive frequency source 58 is connected to a primary winding 135 of the transformer 118 for driving the demodulator 71 in synchronism with the modulator 57. The demodulated A portion of the feedback signal is developed across the feedback potentiometer 20 and the capacitor 78 as previously described.

The B feedback path 15 as shown in FIG. 4 includes identical transistor switch circuitry in the B modulator 72 and B demodulator 77. Thus, the B modulator 72 includes transistors 136, 137, 138 and 139 connected in a ring modulator circuit and B demodulator 77 includes transistors 140, 141, 142 and 143 connected in like manner.

Figure 5:
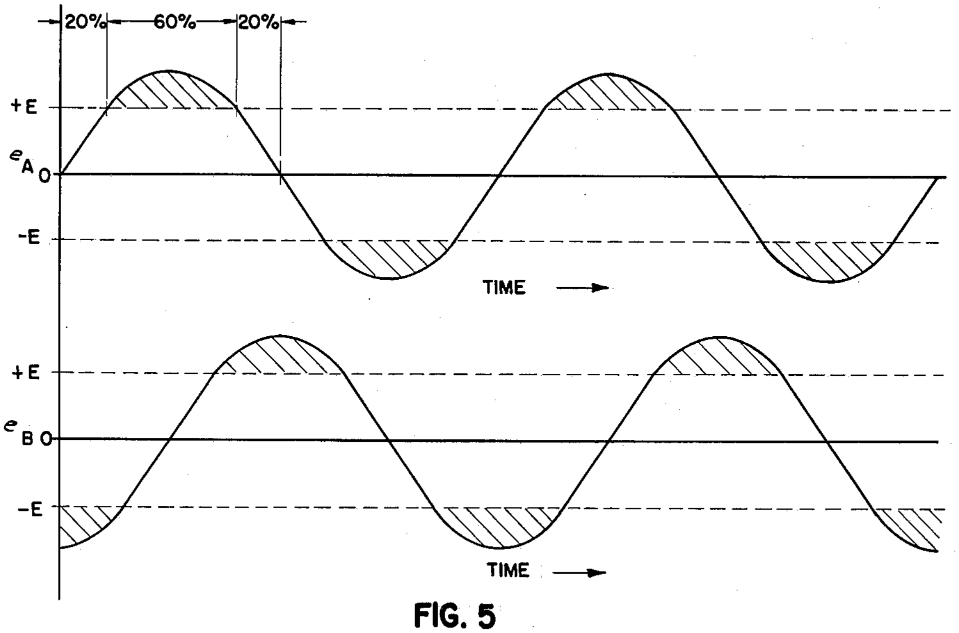
FIG. 5 illustrates representative waveforms for modulating and demodulating drive signals for the circuit of FIG. 4.

Representative drive signals derived from the A source 58 and the B source 73 are illustrated in FIG. 5. Drive signal $e_A$ and drive signal $e_B$ have a sinusoidal waveform with a sufficient amplitude so that during a predetermined portion of each half cycle, a pair of switches in the respective modulator and demodulator are placed in an ON or closed state. In a preferred embodiment of this invention, the transistor bias circuitry, e.g., resistors 90, 91 and parallel connected resistor 94 and capacitor 95 prevents the transistor switches from turning ON until a potential of ±E is applied across the driving transformer secondaries. For example, transistors 80 and 82 are turned ON when the potential rise between respective resistors 97, 96 and 91, 90 is equal to or greater than +E volts, whereas transistors 79 and 81 are turned ON when the potential rise between these resistors is equal to or greater than a potential —E volts. As shown in the diagrams, this potential is maintained by the drive frequency waveform for 60% of each half cycle of drive signal. Thus, transistors 80 and 82 are turned ON for 60% of each half cycle and turned OFF for the remainder of a complete cycle while transistors 79 and 81 are turned ON for 60% of the alternate half cycle and turned OFF for the remainder of each complete cycle. In this way, the output terminals 12, 13 of the amplifier are connected through closed switches to primary 59 of isolation transformer 60 for 60% of each complete cycle. The operation of the A demodulator and the B modulator and demodulator is quite similar, their bias circuitry also being designed to prevent the transistor switches from conducting except during predetermined portions of each cycle of drive signal. The drive signal $e_B$ is, however, delayed in phase 90° to that of the drive signal $e_A$ so that although the dwell and OFF-times of the A and B modulators and A and B demodulators are the same, their operation is not synchronous but rather in a quadrature relationship. The analogous transistors in both feedback paths are thus never all open at the same time. For example, before the transistors 80 and 82 are opened because the signal $e_A$ falls below the potential +E, the transistors 137 and 139 have been caused to close because the signal $e_B$ has become greater than +E. By maintaining the dwell-time for each of the transistor switches greater than half of each half cycle, e.g., 60% as shown in the figure, the two feedback paths slightly overlap in their conduction periods. Thus, as shown in FIG. 5, transistor switches 80 and 82 of the A modulator 57 will be closed for a brief period of time that transistor switches 137 and 139 of the B modulator 72 are closed. As previously described, this overlapping action positively prevents interruption of the feedback signal.

Although drive signals of sinusoidal waveform are shown in FIG. 5 it will be apparent to those skilled in the art that other waveforms may be utilized to drive the transistor switches in the desired manner. Thus, for example, rectangular or trapezoidal waves having the requisite duty cycle to turn the switches ON and OFF with the desired time intervals may be utilized.

The feedback circuitry of the present invention avoids transformer core saturation in the following manner: A changing current $di/dt$ in a transformer winding having L inductance will cause an induced potential $e$ in the winding as defined by the equation $$e=L\frac{di}{dt} \qquad (1)$$

or in integral form $$i=\frac{1}{L}\int e\,dt \qquad (2)$$

where now the integral is the area under the volt-second curve. If, for example, the signal at output terminals 12, 13 is a square wave having the frequency of the drive signal, i.e., the extreme case for core saturation, the current in the primary winding of either transformers 60 or 75 for the dwell period is:

$$i=\frac{1}{L}\int_0^{t_{dwell}} E_{out}dt \qquad (3)$$

where $E_{out}$ is the magitude of the output signal. In order that the transformer core does not saturate, the average current $\Delta i$ must equal zero, or $$\Delta i=i_{OFF}+\frac{1}{L}\int_0^{t_{dwell}} E_{out}dt=0 \qquad (4)$$

where $i_{OFF}$ is the current flowing in the winding during the period when the modulator and demodulator switches are open or OFF. This current will also be described by Equation 2 or $$i_{OFF}=\frac{1}{L}\int_0^{t_{OFF}} e_{OFF}dt \qquad (5)$$

where $e_{OFF}$ is the potential induced across the transformer windings by the current $i_{OFF}$. Substituting Equation 5 in Equation 4 gives the following equation:

$$\Delta i=\frac{1}{L}\int_0^{t_{OF}} e_{OFF}dt\frac{1}{L}+\int_0^{t_{dwell}} e_{out}dt=0 \qquad (6)$$

It will thus be seen that the average current $\Delta i$ will only be zero when the transformer volt-second relationship during the ON switching period is equal to the transformer volt-second relationship during the succeeding OFF period.

As is well known in the art, the current flowing through an inductance cannot change instantaneously; the voltage across an inductor can, however, be discontinuous. Therefore, the current flowing, for example, in the primary winding 59 of the feedback isolation transformer 60 will be the same value and sign just before and after all of the switches of modulator 57 are opened. The voltage across this winding abruptly changes, however, in magnitude and also in sign since the induced voltage must be such as to oppose a decrease in the current flowing through the transformer winding. If the modulator switches are perfect switches, i.e., if they have infinite impedance when open, the magnitude of $e_{OFF}$ will be determined by the internal impedances of the transformer. These comprise the core-loss resistance, the resistance of the primary winding 59 and the distributed capacity between turns and layers of the primary winding. These parameters also determine the time in which the stored energy will be dissipated. It has been found that contemporary high quality transformers assure that the voltages $e_{OFF}$ across the transformer windings very rapidly reach a voltage opposite in sign to that of the feedback signal and substantially larger in magnitude. Thus, the volt-seconds during the 40% OFF period may equalize the volt-seconds during the 60% ON period since, although the OFF-time is less than the ON-time, the voltage magnitude is greater during the OFF-time than the ON-time. Another factor which must also be taken into consideration, however, is that many forms of switches such as transistor switches do not provide an infinite resistance when high reverse potentials are applied thereto but instead "flash-over," i.e., their conduction resistance suddenly decreases to a relatively low value. In order to insure that the volt-seconds in the OFF-time equal the volt-seconds in the ON-time suitable transistors must be selected for the circuit of FIG. 4 which do not flash-over until a reverse voltage generally equal to approximately twice the feedback voltage is applied to the transformer.

Figure 6:
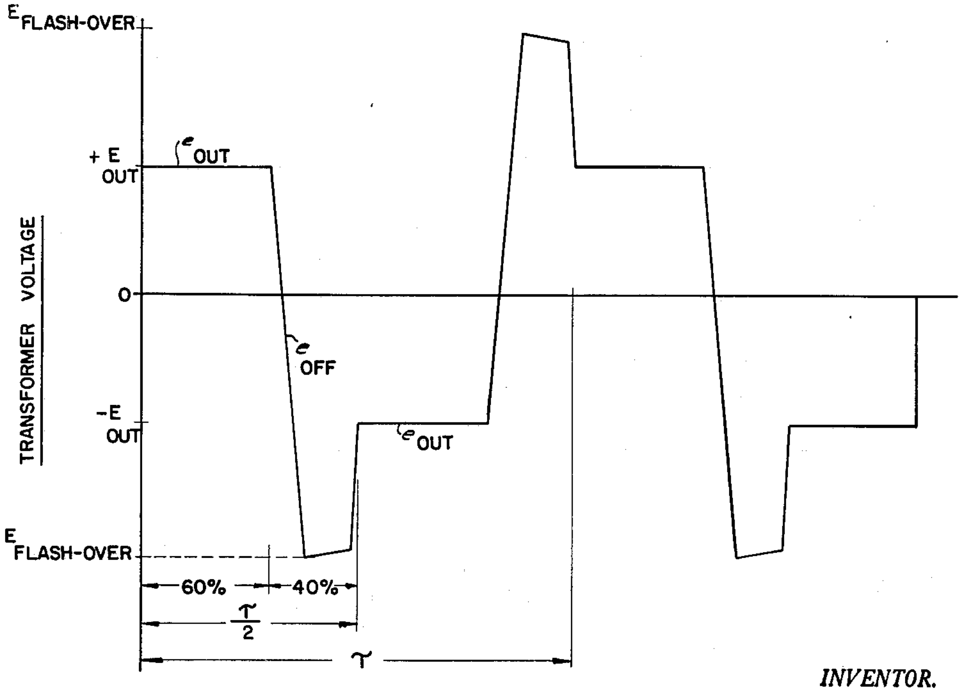
FIG. 6 illustrates the volt-second relationship of the feedback isolation transformers during a typical operation of an amplifier constructed in accordance with this invention.

The operation of the circuit of FIG. 4 when a square wave signal having the frequency of the feedback carrier signal is applied to the output terminals 12, 13 is illustrated in FIG. 6. As shown, the transformer voltage has the magnitude ($E_{out}$) of the signal ($e_{out}$) applied to the output terminals during the dwell-time (60% of $\tau/2$ where $\tau$ is the period of the square wave signal). When the ON switch pair is turned OFF, the voltage of the transformer immediately swings over smoothly to a negative voltage $e_{OFF}$. The maximum value of $e_{OFF}$ must be such that the OFF volt-seconds equal the ON volt-seconds. As noted above, the maximum potential of $e_{OFF}$ may be limited by flash-over of the modulator and demodulator switching transistors so that the maximum potential of $e_{OFF}$ is E flash-over as shown. The potential of $e_{OFF}$ will decrease at a rate determined by the time-constant of the modulator and demodulator circuitry until the other pair of switches of the full wave modulator or demodulator are turned ON. The identical operation then occurs except that $e_{out}$ and $e_{OFF}$ have opposite polarity signs.

The circuitry shown functions in the manner described for each half cycle of drive frequency signal so as to maintain the volt-second areas above and below the zero axis equal. The curve shown in FIG. 6 illustrates the action occurring in either the A feedback path 14 of the B feedback path 15, the only distinction being that the operation of the B path is delayed in phase with respect to the A path.

The high transformer potential $e_{OFF}$ observed when the modulator and demodulator switches of a particular channel are OFF does not appear at the output of either of the feedback paths A and B since the demodulator switches of a particular channel are open or OFF during the same time intervals that the transformer potential $e_{OFF}$ is present. Accordingly, the accuracy of the feedback waveform is not disturbed by the transformer correcting function provided by the present invention.

A particular type of shielding circuit for the amplifiers constructed according to this invention is shown in the circuits of FIGS. 1, 2 and 4. While this type of shielding is preferred, it is not essential to the practice of the invention and it does not constitute a part of the invention. The purposes and functions of the shielding are described in detail in the copending application entitled, "Shielding Circuit," Serial No. 770,386, filed October 29, 1958.

In this preferred shielding arrangement, the transformers 36, 53, 60 and 75 are provided with double shields. A shield 150 around the secondary windings 38 and 54 of the transformers 36 and 53, a shield 151 around the primary windings 59 and 74 of transformers 60 and 75 and a shield 152 around the primary windings 110 and 153 of transformers 93 and 154, and a shield 155 around the primary windings 135 and 156 of transformers 118 and 157 are connected to the common circuit ground. A shield 158 around primary windings 35 and 52 of the transformers 36 and 53, a shield 159 around the secondary windings 70 and 76 of the transformers 60 and 75, and a shield 160 around the secondary windings of the transformers 118 and 157 are interconnected to form a shield around the input side of the amplifier connected to a point in the feedback loop, specifically to the output terminals of the A and B demodulators which are connected to the input lead 11.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

I claim:

1. An ultralinear, wide-band amplifier having isolation between its input and output terminals comprising a forward conduction means for amplifying an error signal having both alternating and direct current fre-quencies, said forward conduction means having an input and an output and an isolation means for isolating the input and output thereof; feedback means comprising a pair of parallel connected paths, each of said paths comprising a series coupled modulator, isolation transformer and demodulator of each feedback path for driving the modula-producing a drive signal coupled to the modulator and demodulator of each feedback path for driving the modulator and demodulator of each feedback path so that said isolation transformers are alternately open circuited for a portion of each cycle of said drive signal; means connecting the input of each modulator to the output of said forward conduction means; and means connecting the output of each demodulator in series with the input of said forward conduction means for producing said error signal.

2. An amplifier comprising forward conduction means having its output isolated from its input for amplifying an error signal having both direct current and alternating frequencies, first and second modulating feedback means connected to the output of said forward conduction means and each including a modulator, an isolation transformer and a demodulator connected output to input, modulator-demodulator drive means for producing a drive signal connected to said modulators and demodulators for alternately connecting the output of said forward conduction means to said isolation transformers for less than a complete cycle of said drive signal, and means connecting the output of said first and second feedback means to the signal applied to the input of said forward conduction means for deriving said error signal.

3. An amplifier constructed according to claim 2 wherein the dwell-time of said first and second feedback means is greater than 50% of the period of said drive signal.

4. An amplifier having isolation between its input and output terminals comprising a forward conduction means for amplifying an error signal having both alternating and direct current frequencies, said forward conduction means having an input and an output and including an isolation means for isolating the input and output thereof; feedback means comprising a pair of parallel connected paths, each of said paths comprising a series coupled modulator, isolation transformer and demodulator; said modulator in each path having an OFF-time sufficiently long so that the excitation current injected into each isolation transformer in each path by said output can decay the flux therein to prevent saturation thereof; means for connecting the input of each modulator to the output of said forward conduction means; and means for connecting the output of each demodulator in series with the input of said forward conduction means for producing said error signal.

5. An amplifier as defined in claim 4 wherein the dwell-times of the respective paths are overlapping so that the feedback signal in series with the amplifier terminals is never interrupted.

6. An amplifier as defined in claim 4 wherein the modulator and demodulator of one of said paths are driven 90° out of phase with respect to the modulator and demodulator of the other of said paths.

7. An amplifier comprising forward conduction means having its output isolated from its input for amplifiying an error signal having both direct current and alternating frequencies and producing an output, polyphase feedback paths connected to the output of said forward conduction means and each including an isolation transformer, each of said feedback paths having an OFF-time sufficiently long so that the excitation current injected into each transformer by said output can decay the flux therein to prevent transformer saturation, and means for adding the output of said polyphase carrier feedback paths to the signal applied to the input of said forward conduction means for deriving said error signal.

8. A conductive path including an isolation transformer for transmitting signals at or very near a drive frequency without saturation of the isolation transformer core comprising first and second parallel coupled paths having an input and each including an isolation transformer, an input signal connected to said input, said first and second paths including means for alternately open circuiting said isolation transformers for a portion of each cycle of drive signal so that said input signal injects an excitation current into each transformer to prevent saturation thereof.

9. A conductive path including an isolation transformer for transmitting signals at or very near a drive frequency without saturation of the isolation transformer core comprising first and second parallel coupled paths having an input and each including a series connected modulator, isolation transformer and demodulator, an input signal connected to said input, said modulator and demodulator in each of said paths having an OFF-time somewhat less than the dwell-time but sufficiently long to allow said input signal to induce a corrective signal in said transformers to equalize the volt-seconds of the OFF-time with the volt-seconds of the dwell-time, the OFF-time of the modulator and demodulator in said first path having an alternate overlapping relation with the OFF-time of the modulator and demodulator in said second path.

References Cited by the Examiner

UNITED STATES PATENTS

| | | | |
|---|---|---|---|
| 2,857,562 | 10/1958 | Umrath | 330—9 X |
| 3,101,451 | 8/1963 | Burgarella et al. | 330—9 X |

FOREIGN PATENTS

| | | |
|---|---|---|
| 37,299 | 7/1956 | Germany. |

ROY LAKE, *Primary Examiner.*

NATHAN KAUFMAN, *Examiner.*